(12) United States Patent
Rösler

(10) Patent No.: US 10,627,879 B2
(45) Date of Patent: Apr. 21, 2020

(54) COMPUTER ARRANGEMENT WITH AIR-CONDUCTING ELEMENT, AND AIR-CONDUCTING ELEMENT

(71) Applicant: Fujitsu Client Computing Limited, Kawasaki (JP)

(72) Inventor: Lutz Rösler, Munich (DE)

(73) Assignee: Fujitsu Client Computing Limited, Kawasaki (JP)

(*) Notice: Subject to any disclaimer, the term of this patent is extended or adjusted under 35 U.S.C. 154(b) by 0 days.

(21) Appl. No.: 16/188,375

(22) Filed: Nov. 13, 2018

(65) Prior Publication Data
US 2019/0146562 A1 May 16, 2019

(30) Foreign Application Priority Data
Nov. 15, 2017 (DE) .......................... 10 2017 126 897

(51) Int. Cl.
G06F 1/20 (2006.01)
G06F 1/18 (2006.01)
H05K 7/20 (2006.01)

(52) U.S. Cl.
CPC ............... *G06F 1/20* (2013.01); *G06F 1/183* (2013.01); *G06F 1/189* (2013.01); *H05K 7/20145* (2013.01); *H05K 7/20172* (2013.01)

(58) Field of Classification Search
USPC ........................................................ 361/695
See application file for complete search history.

(56) References Cited

U.S. PATENT DOCUMENTS

| | | | | |
|---|---|---|---|---|
| 4,084,250 A | * | 4/1978 | Albertine | H05K 1/144 361/679.48 |
| 4,931,904 A | * | 6/1990 | Yiu | H05K 7/20172 361/690 |
| 5,136,468 A | * | 8/1992 | Wong | G06F 1/184 361/679.6 |
| 5,218,514 A | * | 6/1993 | Huynh | G06F 1/20 165/80.3 |
| 5,338,214 A | * | 8/1994 | Steffes | G06F 1/184 361/679.32 |
| 5,505,533 A | * | 4/1996 | Kammersqard | A45C 13/26 312/236 |
| 5,559,673 A | * | 9/1996 | Gagnon | G06F 1/20 165/122 |
| 5,673,029 A | * | 9/1997 | Behl | G06F 1/20 340/584 |
| 5,772,500 A | * | 6/1998 | Harvey | G06F 1/20 415/182.1 |
| 5,790,372 A | * | 8/1998 | Dewey | G06F 1/189 312/223.2 |
| 5,808,867 A | * | 9/1998 | Wang | G06F 1/18 361/679.49 |

(Continued)

*Primary Examiner* — William H. Mayo, III
*Assistant Examiner* — Krystal Robinson
(74) *Attorney, Agent, or Firm* — DLA Piper LLP (US)

(57) ABSTRACT

A computer arrangement includes a case, at least one guiding rail arranged in the case, and an air-conducting element, wherein the air-conducting element includes at least one profile rail, the at least one profile rail interacts with the at least one guiding rail so that the air-conducting element is insertable along the guiding rail into the case, the air-conducting element is configured tunnel-shaped, and a fan is arranged in an inlet region and/or in an outlet region of the air-conducting element.

11 Claims, 2 Drawing Sheets

(56) References Cited

U.S. PATENT DOCUMENTS

| | | | | |
|---|---|---|---|---|
| 5,912,799 | A * | 6/1999 | Grouell | G11B 33/126 312/223.2 |
| 6,021,042 | A * | 2/2000 | Anderson | G06F 1/20 165/127 |
| 6,025,989 | A * | 2/2000 | Ayd | G06F 1/183 312/236 |
| 6,115,250 | A * | 9/2000 | Schmitt | H05K 7/20727 165/104.34 |
| 6,185,097 | B1 * | 2/2001 | Behl | G06F 1/20 361/695 |
| 6,288,898 | B1 * | 9/2001 | Johnson | G06F 1/183 165/104.33 |
| 6,354,861 | B2 * | 3/2002 | Schmitt | H01R 13/629 361/679.37 |
| 6,411,511 | B1 * | 6/2002 | Chen | G06F 1/20 165/104.33 |
| 6,414,845 | B2 * | 7/2002 | Bonet | H05K 7/20581 312/236 |
| 6,496,366 | B1 * | 12/2002 | Coglitore | G06F 1/18 174/377 |
| 6,537,019 | B1 * | 3/2003 | Dent | F04D 25/166 361/679.48 |
| 6,603,661 | B2 * | 8/2003 | Smith | G06F 1/183 165/80.3 |
| 6,693,796 | B2 * | 2/2004 | Ives | G11B 33/08 312/223.1 |
| 6,722,971 | B2 * | 4/2004 | Gough | G06F 1/20 361/695 |
| 7,002,796 | B2 * | 2/2006 | Lao | G06F 1/184 165/121 |
| 7,245,490 | B2 * | 7/2007 | Chou | F04D 29/601 361/694 |
| 7,361,081 | B2 * | 4/2008 | Beitelmal | H05K 7/20727 361/691 |
| 7,397,660 | B2 * | 7/2008 | Strmiska | G06F 1/20 361/679.48 |
| 7,408,772 | B2 * | 8/2008 | Grady | H05K 7/20581 165/122 |
| 7,542,300 | B1 * | 6/2009 | Lui | G06F 1/183 312/223.2 |
| 8,320,120 | B1 * | 11/2012 | Chan | H05K 7/20727 165/121 |
| 9,017,020 | B2 * | 4/2015 | Charest | F04D 25/0613 415/198.1 |
| 9,913,401 | B2 * | 3/2018 | Gonzalez Inda | H05K 7/20172 |
| 9,999,153 | B1 * | 6/2018 | Peng | G11B 33/142 |
| 2002/0094772 | A1 * | 7/2002 | Gough | G06F 1/20 454/184 |
| 2003/0147216 | A1 * | 8/2003 | Patel | H05K 7/20754 361/700 |
| 2004/0150950 | A1 * | 8/2004 | Brooks | G06F 1/183 361/679.5 |
| 2005/0068723 | A1 * | 3/2005 | Squillante | G06F 1/181 361/679.46 |
| 2005/0241810 | A1 * | 11/2005 | Malone | F04D 27/004 165/122 |
| 2006/0285292 | A1 * | 12/2006 | Fan | H05K 7/20172 361/695 |
| 2007/0297132 | A1 * | 12/2007 | Wang | G06F 1/20 361/695 |
| 2008/0094799 | A1 * | 4/2008 | Zieman | G06F 1/20 361/695 |
| 2009/0016906 | A1 * | 1/2009 | Li | G06F 1/20 417/360 |
| 2009/0147473 | A1 * | 6/2009 | Yi | H05K 7/20172 361/695 |
| 2009/0249862 | A1 * | 10/2009 | Glover | G06F 1/20 73/30.04 |
| 2010/0232976 | A1 * | 9/2010 | Li | G06F 1/20 416/244 R |
| 2011/0051358 | A1 * | 3/2011 | Searby | G06F 1/20 361/679.48 |
| 2011/0110029 | A1 * | 5/2011 | Lodhia | G06F 1/20 361/679.47 |
| 2011/0158791 | A1 * | 6/2011 | Li | G06F 1/20 415/119 |
| 2011/0164384 | A1 * | 7/2011 | Vogel | F28D 1/024 361/696 |
| 2012/0026677 | A1 * | 2/2012 | Bhutani | F04D 25/0613 361/679.48 |
| 2017/0273214 | A1 * | 9/2017 | Casparian | G06F 1/203 |

* cited by examiner

COMPUTER ARRANGEMENT WITH AIR-CONDUCTING ELEMENT, AND AIR-CONDUCTING ELEMENT

TECHNICAL FIELD

This disclosure relates to a computer arrangement including a case and an air-conducting element, as well as an air-conducting element for such a computer arrangement.

BACKGROUND

Air-conducting elements are utilized in computer arrangements to guide air flows generated by fans in the interior of a case of the computer arrangement so that elements to be cooled of the computer arrangement are supplied with cooling air.

To supply the elements to be cooled with cooling air, the air-conducting elements are fastened with fastening devices, for example, by latching or screwing, for example, to a case or a system board of the computer arrangement. Among other things, it is problematic that, to fasten the air-conducting element, in most cases a considerable force is applied, which can lead to damaging the air-conducting element or other components of the computer arrangement.

It could therefore be helpful to provide a computer arrangement and an air-conducting element to reduce or limit the damage issue described above.

SUMMARY

I provide a computer arrangement including a case, at least one guiding rail arranged in the case, and an air-conducting element, wherein the air-conducting element includes at least one profile rail, the at least one profile rail interacts with the at least one guiding rail so that the air-conducting element is insertable along the guiding rail into the case, the air-conducting element is configured tunnel-shaped, and a fan is arranged in an inlet region and/or in an outlet region of the air-conducting element.

I also provide an air-conducting element including at least one profile rail configured to insert the air-conducting element on the at least one profile rail along at least one guiding rail of the computer arrangement including a case, at least one guiding rail arranged in the case, and an air-conducting element, wherein the air-conducting element includes at least one profile rail, the at least one profile rail interacts with the at least one guiding rail so that the air-conducting element is insertable along the guiding rail into the case, the air-conducting element is configured tunnel-shaped, and a fan is arranged in an inlet region and/or in an outlet region of the air-conducting element, the air-conducting element is configured tunnel-shaped, and a fan is arranged in an inlet region and/or in an outlet region of the air-conducting element.

Figure 1:
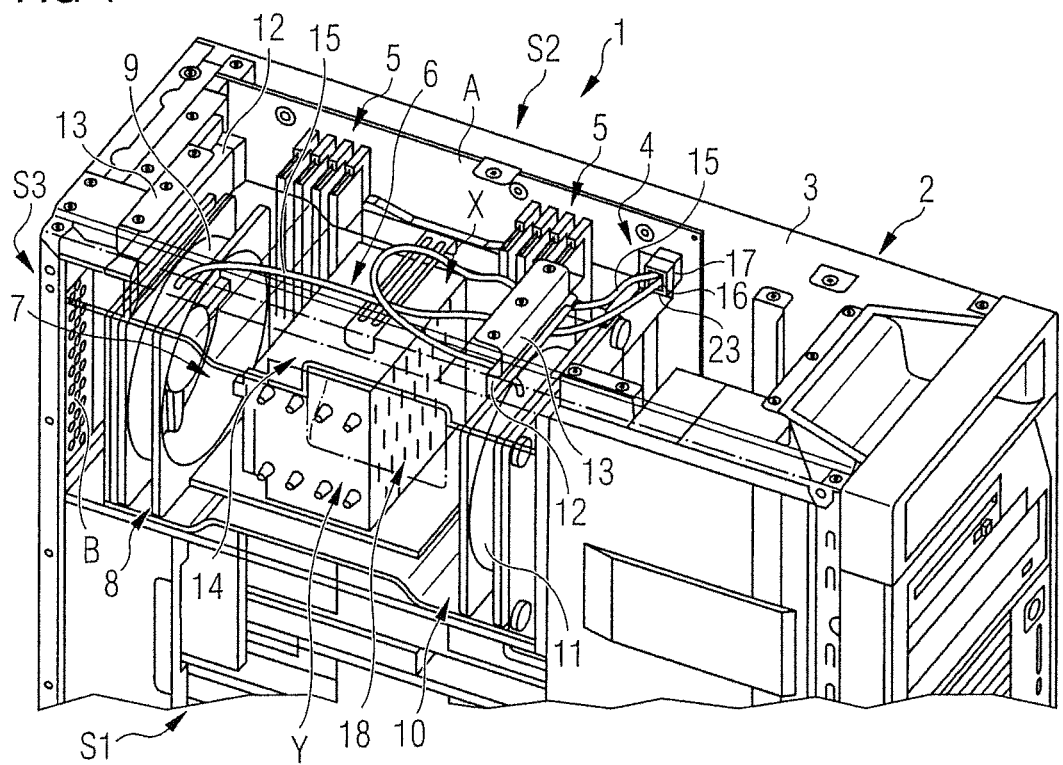
FIG. 1 shows a perspective representation of a part of a computer according to an example.

LIST OF REFERENCE CHARACTERS 1 computer
2 case
3 upper case panel
4 system board
5 memory module
6 cooling body
7 air-conducting element
8 first tunnel end
9 first fan
10 second tunnel end
11 second fan
12 profile rail
13 guiding rail
14 recess
15 cable
16 plug connector
17 jack
18 grip
19 covering
20 funnel-shaped opening
21 tongue
22 protrusion
23 bracket
S1 first side of the case
S2 second side of the case
S3 third side of the case
A second side wall of the case
B third side wall of the case
X first outer side wall of the air-conducting element
Y second outer side wall of the air-conducting element

DETAILED DESCRIPTION

I provide a computer arrangement including a case, at least one guiding rail arranged in the case, and an air-conducting element. The air-conducting element comprises at least one profile rail, that interacts with the at least one guiding rail so that the air-conducting element may be pushed into the case along the at least one guiding rail. The air-conducting element is configured in a tunnel-shaped manner, and a fan is arranged in an inlet region and/or in an outlet region of the air-conducting element.

An advantage thereby gained in that a computer arrangement with such a device for the mechanical fastening of the air-conducting element allows an assembly-friendly attachment of the air-conducting element. Damage to the air-conducting element, or components of the computer arrangement, to which the air-conducting element is fastened, is thus avoided, as only a slight force must be exerted on the at least one guiding rail for the insertion of the air-conducting element. It is a further advantage that inserting and pulling-out the air-conducting element is possible with only one hand and slight application of force. Access to components to be cooled that are located underneath or behind the air-conducting element, is thus greatly simplified compared to an arrangement in which an air-conducting element is fastened through a screwing or a latching, for example. Such a configuration makes a quick and simple installation of fans in the computer arrangement possible. Moreover, the fans can, together with the air-conducting element, be pulled out of the case with only one hand. Thus, the fans can, for example, be repaired or exchanged, without having to access inaccessible locations of the computer arrangement.

The air-conducting element may comprise, on a side wall, a receiving region for at least one signal- and/or one power cable of the at least one fan.

It is an advantage that signal- and/or power cables of the at least one fan are not damaged in the inserting of the air-conducting element. Such cables must, for example, in the introduction of the air-conducting element into the case of the computer arrangement, be connected, via a plug connector, with a system board of the computer arrangement. The receiving region prevents cables from being able to impair the insertion movement in the insertion of the air-conducting element, which could lead to a shearing of the cables. It is a further advantage that the cables are, without further fastening devices such as, for example, cable ties stowed in the receiving region. This allows a more rapid installation and de-installation of the air-conducting element.

The receiving region of the air-conducting element may be closed off with a covering.

It is an advantage that the cables are additionally protected against damage, for example, through a de-installation or installation of other components into the computer arrangement as well as, for example, against dust. Cable connectors can also be protected in the receiving region under the covering. Furthermore, the cables in such a configuration are stored such that they are not visible in the computer arrangement in a closed covering.

The computer arrangement may further include a system board on which at least one component to be cooled is arranged, wherein an insertion direction of the air-conducting element extends along a direction perpendicular to an extension plane of the system board towards the system board so that the air-conducting element at least partially surrounds the at least one component to be cooled, after an insertion.

Air-conducting elements are frequently fastened onto system boards to conduct cooling air onto the elements to be cooled, which elements are arranged on the system board. For this purpose, space for the fastening of the air-conducting elements onto the system board is needed, however. Moreover, a considerable force must be exerted to, for example, latch or screw the air-conducting element to the system board. Jamming the air-conducting element in the fastening onto the system board can also occur. This can lead to damage to the system board. It is therefore advantageous here that the air-conducting element is inserted into the case in a direction perpendicular to the extension plane of the system board towards the system board, but is not fastened to the system board itself, however. The air-conducting element can be inserted such that it is arranged in an end position, distanced to the system board. Alternatively, the air-conducting element can be inserted such that it is in contact with the system board at least one point. Damage to the system board is thus avoided.

The at least one guiding rail may be attached to a case panel of the case so that the air-conducting element can be inserted hangingly on the case.

In this way, the weight of the air-conducting element can be ideally distributed on side walls of the case.

I also provide an air-conducting element. The air-conducting element comprises at least one profile rail configured to insert the air-conducting element on the at least one profile rail along at least one guiding rail of a computer arrangement discussed above. The air-conducting element is configured in a tunnel-shaped manner, and a fan is arranged in an inlet region and/or in an outlet region of the air-conducting element The air-conducting element may further include a receiving region for at least one power- and/or one signal cable of the at least one fan.

The air-conducting element may include a removable covering that closes off the receiving region.

Advantages of the air-conducting element substantially correspond to the advantages of the computer arrangement.

Further advantageous configurations of the computer arrangement and the air-conducting element are described by an example. The example is described based on the appended figures. Elements with same reference characters are, if necessary, described in more detail only in their first occurrence.

FIG. 1 shows a perspective representation of a part of a computer 1 according to an example. The computer 1 includes a case 2 on a first side S1 projecting out of the drawing plane, comprising a removable side wall that is removed in the representation of FIG. 1. An upper case panel 3 that represents a ceiling of the case 2 is represented as transparent in FIG. 1 to better recognize an interior of the case 2 of the computer 1.

A system board 4 is arranged on a second side wall A of the case 2 on a second side S2 of the case 2 opposite the first side S1 of the case 2. Different components are arranged on a surface of the system board 4 facing away from the second side wall A: between respectively four memory modules 5, a processor is arranged on the system board 4, above which a cooling body 6 is fastened to cool the processor. The cooling body 6 protrudes perpendicularly from the system board 4.

To supply the cooling body 6 with cooling air, the computer 1 comprises a tunnel-shaped air-conducting element 7 placed over the cooling body 6 so that it surrounds the cooling body 6 on three sides. In FIG. 1, the air-conducting element 7 is represented partially transparently to provide a view into the interior of the air-conducting element 7. On a side facing towards the system board 4, the air-conducting element 7 is open so that it can be inserted over the cooling body 6, along a direction perpendicular to an extension plane of the system board 4, towards the system board 4. The air-conducting element 7 is attached at a distance to the system board 4, and does not directly contact a surface of the system board 4. Alternatively, the air-conducting element 7 can also be configured such that it rests upon the system board 4 in an inserted state.

On a first tunnel end 8 adjacent to a third side wall B on a third side S3 of the case 2, and directed in the direction of the third side wall B, a first fan 9 is arranged. The third side wall B comprises openings in a region adjacent to the first tunnel end 8 so that the first fan 9 can blow outgoing air out of the air-conducting element 7, through the openings in the third side wall 4, out of the case 2. The first fan 9 thus suctions the cooling air with which the cooling body 6 was cooled out of the interior of the air-conducting element 7. Furthermore, the air-conducting element 7 is configured so that the memory modules 5 are likewise cooled by the cooling air in the interior of the air-conducting element 7.

On a second tunnel end 10 of the air-conducting element 7 opposite the first tunnel end 8, the air-conducting element 7 comprises a second fan 11 attached parallel to the first fan 9. The second fan 11 suctions the air from the interior of the case 2 out of a region lying in front of the second tunnel end 10, outside of the air-conducting element 7, and blows it as cooling air into the air-conducting element 7. In the region lying in front of the second tunnel end 10, two front drives are attached in this configuration, the warm air of which is suctioned off by the second fan 11 and, through the air-conducting element 7, is blown out of the case 2, through the openings in the third side wall B. The air flow, described here and generated by the fans 9 and 11, is largely separated from other air flows in the case 2. The first tunnel end 8 serves as outlet region and the second tunnel end 10 serves as inlet region for a cooling air flow through the air-conducting element 7.

On a first outer side wall X of the air-conducting element 7 facing the upper case panel 3, the air-conducting element 7 comprises respectively one profile rail 13 in a region of the first tunnel end 8 and a region of the second tunnel end 10. On the upper case panel 3, in a region of the first tunnel end 8 and of the second tunnel end 10, one guiding rail 13 is respectively attached. The guiding rails 13 are fastened, with one end, on the upper case panel 3, and engage with an opposite end into the profile rails 12 of the air-conducting element 7. The air-conducting element 7 is thus arranged in the case 2 hangingly on the upper case panel 3. The air-conducting element 7 can be pulled out from the first side S1 of the case 2, along the guiding rails 13, out of the case 2, and inserted into the case 2.

The guiding rails 13 represent a guide for the air-conducting element 7 in the insertion into the case 2. In this example, the profile rails 12 are configured such that they partially engage around the free-standing ends of the guiding rails 13. Alternatively to the configuration shown here, the features of the guiding rails 13 and the profile rails 12, in a region, in which the rails 12, 13 interact, can also be configured reversed so that the guiding rails 13 engage around the profile rails 12. Alternatively, the profile- and the guiding rails 12, 13, can, for example, also be respectively configured opposite L-shaped in the region of the interaction. Generally, configurations are sufficient in which the guiding rails 13 are formed such that the air-conducting element 7 with correspondingly formed profile rails 12 can be inserted hangingly along the guiding rails 13.

The first outer side wall X of the air-conducting element 7 comprises a recess 14 between the profile rails 12. This recess 14 serves as a receiving region for, respectively, a cable 15 of the first fan 9 and of the second fan 11. The cables of the fans 9 and 11 are attached to a plug connector 16. The plug connector 16 is attached to a bracket 23 provided for this purpose in the region of the second tunnel end 10, and faces in the direction of the system board 4. A jack 17, with which the plug connector 16 is connected, is attached to the system board 4 at a corresponding spot. Via this connection, a voltage and signals for operating and controlling the fans 9 and 11 are provided.

The plug connector 16 is mounted in a floating manner on the bracket 23 in the region of the second tunnel end 10 so that the plug connector 16 in an inserting of the air-conducting element 7, finds the jack 17 and connects with it even if the attachment of the plug connector 16 comprises tolerances, or a lateral offset between the plug connector 16 and the jack 17 arises in assembly movements. In this example, the plug connector 16 is mounted on the bracket 23 such that the plug connector 16 can freely move roughly 2 mm in a plane on which the plug direction of the plug connector 16 vertically stands. The jack 17 is formed funnel-shaped so that the funnel shape can securely guide the floating plug connector 16 into a plug position.

In the example according to FIG. 1, the air-conducting element 7 is connected, via the guiding rails 13, with the upper case panel 3, and is connected, via the plug connector 16, with the system board 4. A second outer side wall Y of the air-conducting element 7 facing the first side S1 of the case 2 is configured such that the removable first case wall, if it is attached to the case 2, presses on the second outer side wall Y of the air-conducting element 7, and the air-conducting element 7 is thus secured in the case 2. Further fastening devices for the air-conducting element 7 are not necessary in this configuration.

In this way, no rigid, mechanical fastening of the air-conducting element 7 to the system board 4 is produced for which a considerable application of force onto the system board 4 is needed, in an insertion or pulling out of the air-conducting element 7. The connection between plug connector 16 and jack 17 necessitates only a low force exertion that does not damage the system board 4. Insertion of the air-conducting element 7 on the guiding rails 13 thus makes an installation, gentle for the system board 4, of the air-conducting element 7 possible.

The second other side wall Y of the air-conducting element 7 furthermore comprises a grip 18 at which the air-conducting element 7 can be pulled out of the case 2 or can be inserted into the case 2 with one hand. This configuration of the air-conducting element 7 makes an assembly-friendly, quick, and economical installation and removal of the air-conducting element 7 possible.

Figure 2:
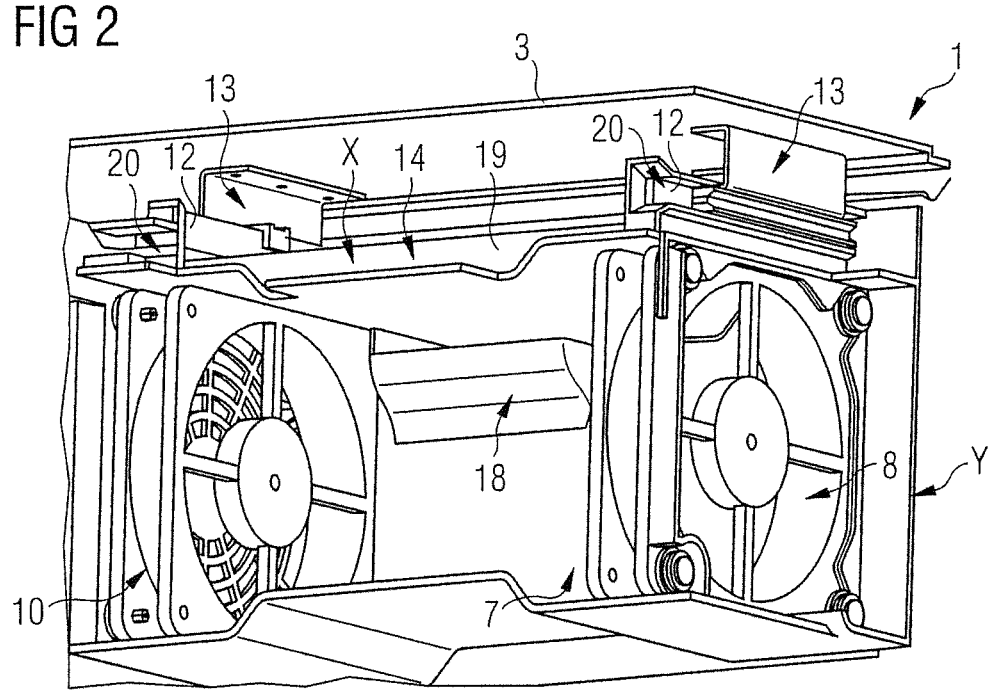
FIG. 2 shows a perspective representation of a detail of the computer with the air-conducting element according to FIG. 1.

FIG. 2 shows a perspective representation of a detail of the computer 1 with the air-conducting element 7 according to FIG. 1. The representation in FIG. 2 shows the air-conducting element 7 from a view of the side of the system board 4 in FIG. 1.

Above the recess 14 of the air-conducting element 7, a removable covering 19 is attached, which closes off the recess 14. In this way, cables, which can be received in the recess are, for example, protected from dust. Additionally, cables can be securely stored in the recess 14 in this way so that the cables are not damaged in an insertion of the air-conducting element 7 into the case 2 or in an installation of other components in the case 2.

The profile rails 12 of the air-conducting element 7 comprise funnel-shaped openings 20 in a front region. These funnel-shaped openings 20 facilitate placement of the profile rails 12 of the air-conducting element 7 on the guiding rails 13 in an insertion of the air-conducting element 7 into the case 2.

Figure 3:
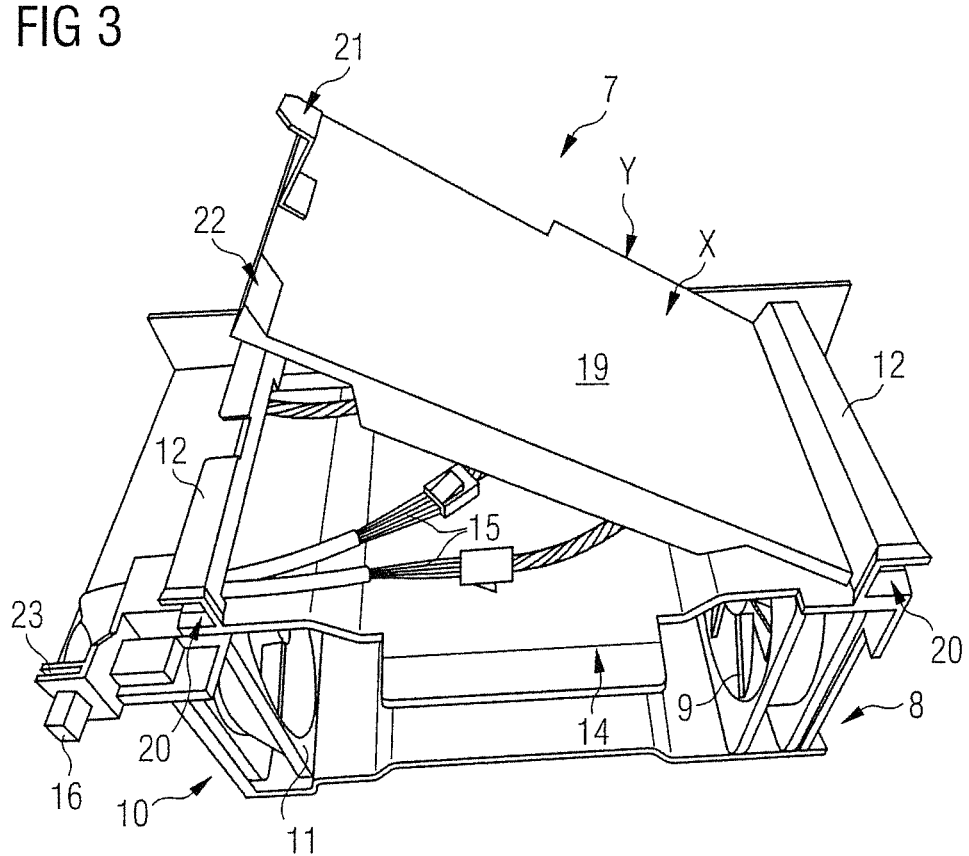
FIG. 3 shows a perspective representation of the air-conducting element according to FIG. 1.

FIG. 3 shows a perspective representation of the air-conducting element 7 according to FIGS. 1 and 2. In the representation of FIG. 3, the cables 15 of the fans 9 and 11 lead from the fans 9 and 11 into the receiving region on the first outer side wall X of the air-conducting element 7. The removable covering 19, with which the receiving region can be closed off, is half-opened in this representation.

On the opened side of the covering 19, the covering 19 comprises a tongue 21 and a protrusion 22. The tongue 21 serves to latch the covering in a closed state. The latch can, through a manual actuation of the tongue 21, be released. The protrusion 22 of the covering 19 generates a channel through which the cables 15 run from the receiving region to the bracket 23 if the covering 19 is closed. In this way, the protrusion 22 covers the cables 15. The cables 15 are thus also protected at this location, for example, from damage or dust.

On a side of the covering 19 hung in the representation of FIG. 3, the covering 19 comprises two tabs not visible in this representation, with which the covering 19 is hung in openings provided for this purpose on the air-conducting element 7.

The invention claimed is:

1. A computer arrangement comprising:
   a case,
   at least one guiding rail arranged in the case and attached to an upper case panel of the case, and
   an air-conducting element, wherein the air-conducting element comprises at least one profile rail, the at least one profile rail interacts with the at least one guiding rail so that the air-conducting element is hangingly insertable along the guiding rail into the case in an insertion direction perpendicular to a hanging direction of the air-conducting element on the upper case panel, and the air-conducting element is configured tunnel-shaped, and a fan is arranged in an inlet region and/or in an outlet region of the air-conducting element.

2. The computer arrangement according to claim 1, wherein the air-conducting element, on a side wall, comprises a receiving region for at least one signal- and/or one power cable of the at least one fan.

3. The computer arrangement according to claim 2, wherein the receiving region of the air-conducting element can be closed off with a covering.

4. The computer arrangement according to claim 1, further comprising a system board on which at least one component to be cooled is arranged, wherein a direction of insertion of the air-conducting element extends along a direction perpendicular to an extension plane of the system board towards the system board so that the air-conducting element, after an insertion, at least partially surrounds the at least one component to be cooled.

5. An air-conducting element comprising at least one profile rail configured to insert the air-conducting element on the at least one profile rail along at least one guiding rail attached to the upper case panel of the case of the computer arrangement according to claim 1, wherein the air-conducting element is hangingly insertable along the guiding rail into the case in a insertion direction perpendicular to a hanging direction of the air-conducting element on the upper case panel of the case, and the air-conducting element is configured tunnel-shaped, and a fan is arranged in an inlet region and/or in an outlet region of the air-conducting element.

6. The air-conducting element according to claim 5, wherein the air-conducting element further includes a receiving region for at least one power- and/or signal cable of the at least one fan.

7. The air-conducting element according to claim 6, further comprising a covering that closes off the receiving region.

8. The computer arrangement according to claim 1, further comprising a plug connector which is connected with a cable of the fan, wherein the plug connector is arranged in a region of a tunnel end of the tunnel-shaped air-conducting element and configured to connect to a system board.

9. The computer arrangement according to claim 8, wherein the plug connector is mounted in a floating manner on a bracket provided in the region of the tunnel end.

10. The air-conducting element according to claim 5, further comprising a plug connector which is connected with a cable of the fan, wherein the plug connector is arranged in a region of a tunnel end of the tunnel-shaped air-conducting element and configured to connect to a system board of the computer arrangement.

11. The air-conducting element according to claim 10, wherein the plug connector is mounted in a floating manner on a bracket provided in the region of the tunnel end.

* * * * *